United States Patent [19]

Tada

[11] Patent Number: 4,743,843
[45] Date of Patent: May 10, 1988

[54] DISPLAY SIGNAL GENERATOR DEVICE
[75] Inventor: Hideaki Tada, Nagoya, Japan
[73] Assignee: Mitsubishi Denki Kabushiki Kaisha, Japan
[21] Appl. No.: 860,191
[22] PCT Filed: Aug. 30, 1985
[86] PCT No.: PCT/JP85/00478
§ 371 Date: Apr. 22, 1986
§ 102(e) Date: Apr. 22, 1986
[87] PCT Pub. No.: WO86/01594
PCT Pub. Date: Mar. 13, 1986
[30] Foreign Application Priority Data
Aug. 31, 1984 [JP] Japan ................. 59-181699
[51] Int. Cl.⁴ ............................................. G01R 1/00
[52] U.S. Cl. ............................. 324/114; 324/120
[58] Field of Search ........... 324/77 A, 99 D, 99 R, 324/114, 120, 115, 125

[56] References Cited
U.S. PATENT DOCUMENTS
3,689,835  9/1972  Bickfrod ............................ 324/114
3,794,916  2/1974  Ritzenthaler ..................... 324/99 D
4,081,745  3/1978  Yasunaga ......................... 324/99 D
4,415,855  11/1983  Dubauskas ......................... 324/114

FOREIGN PATENT DOCUMENTS
48-87873   11/1973  Japan .
50-119680  9/1975   Japan .
54-27674   3/1979   Japan .
55-53461   4/1980   Japan .
55-113969  8/1980   Japan .

Primary Examiner—Stewart J. Levy
Assistant Examiner—Louis M. Arana
Attorney, Agent, or Firm—Leydig, Voit & Mayer

[57] ABSTRACT

A display signal generator device which allows the pulse width of a digital signal to be constant and the pulse repetition period to be proportional to the analog amount of an input signal so as to produce a signal to be displayed even by an analog or digital display unit 7 or 6, thereby obtaining a digital/analog common signal of average value proportional to the frequency even with the pulse signal. In order to maintain the pulse width constant, only a monostable multivibrator is, for example, added, thereby providing an inexpensive display signal generator device.

3 Claims, 2 Drawing Sheets

DISPLAY SIGNAL GENERATOR DEVICE

TECHNICAL FIELD

The present invention relates to a display signal generator device connected to an analog or digital display unit for generating a display pulse train signal regulated to display on any of analog and digital display units.

BACKGROUND ART

A conventional display signal generator device of this type needs to convert a certain signal into a signal of analog magnitude in the case of displaying the certain signal on an analog display unit, while the display signal generator device needs to convert the certain digital signal into a signal in the case of displaying the certain signal on a digital display unit.

As described above, the conventional display signal generator device requires a unit for processing the signal to be displayed corresponding to the format of the display unit, i.e., analog or digital. Thus, the conventional device is complicated in construction or needs to have two types of units for one for analog and one for digital, and is thus uneconomical.

DISCLOSURE OF THE INVENTION

It is therefore an object of the present invention to overcome such deficiency of the conventional display signal generator device. More particularly, the present invention has for its object to provide a display signal generator device which can convert a signal to be displayed into a frequency signal having a pulse repetition rate corresponding to the content of the signal, set the width of each pulse of this frequency signal to a predetermined value to thereby generate a pulse train signal capable of being applied to the display unit even if the display unit is of analog or digital type.

According to the present invention, there is provided a display signal generator device, which comprises: a converter for converting digital data representing the level of a signal to be displayed into a frequency signal in the form of a pulse train, and a pulse generator which outputs a signal for a digital display unit from the converter which has a predetermined pulse width in the output signal of the pulse generator so as to be capable of also driving an analog display unit.

In accordance with the present invention, the signal for the digital display unit has a pulse repetition rate corresponding to the content of the signal to be displayed, and is digitally displayed by an ordinary digital display unit using a counter, while the signal for the analog display unit has a value corresponding to the content of the signal to be displayed with the average value of the signal, and the analog display unit such as a meter is analog-displayed in response to the average value.

BEST MODE FOR CARRYING OUT THE INVENTION

Figure 1:
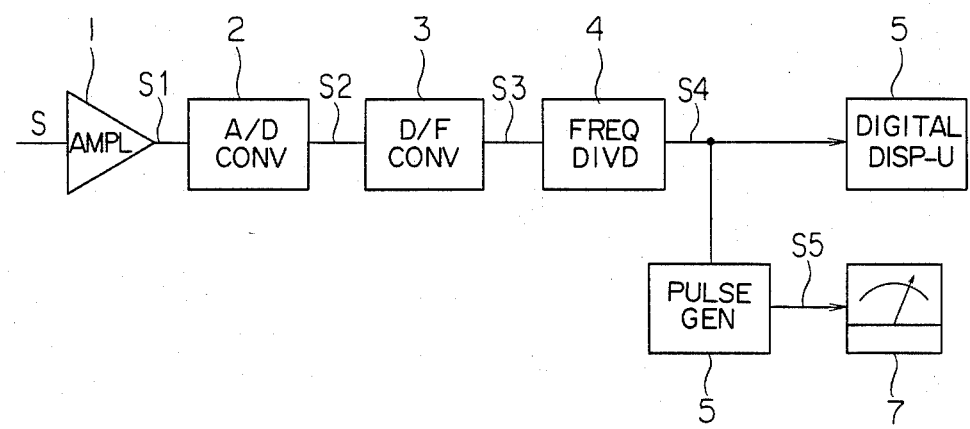
FIG. 1 is a block diagram of a display signal generator device according to one embodiment of the present invention.

FIG. 1 is a block diagram showing an embodiment of a display signal generator device according to the present invention. Numeral 1 designates an amplifier, which amplifies an input signal S having a certain analog magnitude. Numeral 2 designates an analog-to-digital (A/D) converter for analog-to-digital converting a signal S1 which is output from the amplifier 1, numeral 3 designates a frequency (D/F) converter having a rate multiplier for generating a signal S3 in the form of a pulse train from a signal S2 of the A/D converter 2, numeral 4 designates a frequency divider for suitably dividing the frequency of the signal S3 and supplying a signal S4 to a digital display unit 6, and numeral 5 designates a pulse generator which is, for example, a monostable multivibrator, which accepts the signal S4, applies a pulse width $T_0$ to the pulse and supplies a signal S5 to an analog display unit 7 such as, for example, a movable coil type ammeter.

The operation of the display signal generator device will be described with reference to FIG. 2.

The input signal S having a certain analog amount is amplified by the amplifier 1 to become the signal S1, and the signal S1 is inputted to the A/D converter 2. The converter 2 analog-to-digital converts the signal S1 and outputs a digital signal S2 (not shown) having data of the content of analog level of the signal S2.

Then, the D/F converter 3 generates a signal S3 having a frequency corresponding to the content of the digital signal S2. Thus, the digital amount is converted to frequency information in the form of a pulse train having a related pulse repetition rate.

Figure 2:
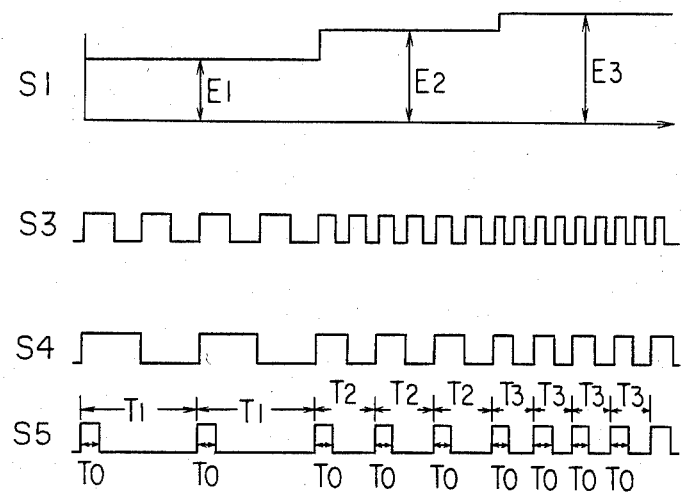
FIG. 2 is a waveform diagram showing the operation of the display signal generator device shown in FIG. 1.

The signal S3 has a pulse waveform as shown in FIG. 2, and is divided by the frequency divider 4 to produce the signal S4. The signal S4 corresponds in frequency to the analog magnitude of the input signal S, is input to the digital display unit 6, and digitally displayed, for example, by numeric characters.

The signal S4 is also input to the pulse generator 5 of a monostable multivibrator, becomes a signal S5 of a pulse train having a pulse width $T_0$ and pulse repetition periods $T_1$, $T_2$ and $T_3$, and is supplied to the analog display unit 7.

The analog display unit 7, for example, employs a movable coil type ammeter (DC 1 mA). Since this has an inertia, the display unit 7 does not display in response to the pulse waveform of the signal S5, but displays in response to the average value of the signal S5.

The average value of the signals S5 corresponds to the analog amount of the input signal S.

More specifically, the signal becomes a pulse train signal having a period $T_1$ and a pulse width $T_0$ for the voltage $E_1$ of the signal S1, and similarly becomes a pulse train signal having a period $T_2$ for the voltage $E_2$ and a period $T_3$ for the voltage $E_3$.

If the period T of the signal S5 is excessively lower than the inertia of the meter 7, the pointer of the meter vibrates. Thus, in order to provide suitable period T and pulse width $T_0$ for the signal S5 corresponding to the characteristics of the meter 7, the frequency divider 4 and the pulse generator 5 may be respectively selected to provide an appropriate frequency division ratio and pulse width.

The pulse generator 5 may be a counter which is constructed to count clock signals from the inflection point of the pulse signal S4 inputted only for the time of the pulse width $T_0$.

Figure 3:
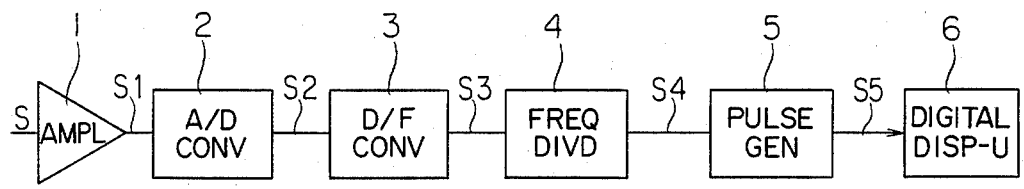
FIG. 3 is a block diagram of a display signal generator device according to another embodiment of the invention.

FIG. 3 shows another embodiment of the present invention, and, as apparent from FIG. 2, the input terminal of the digital unit 6 is provided at the output of the pulse generator 5 so as to receive the signal S5 to digitally count.

According to the present invention, the display signal generator device is constructed to output a signal for a converter digital display unit for converting the digital data representing the level of the signal to be displayed into a frequency signal in the form of a pulse train, and to output a signal for an analog display unit from the pulse generator having a predetermined pulse width for the signal of the converter. Therefore, even if the display unit is of analog type or digital type, the corresponding signal can be produced by a simple circuit.

What is claimed is:

1. A display signal generating device having a digital to frequency converter for converting digital data representing the level of a signal to be displayed into a frequency signal in the form of a pulse train, said device comprising a frequency divider for dividing the frequency of the output signal of the digital to frequency converter to output a signal for a digital display unit, and a pulse generator for providing a predetermined pulse width in the signal of the frequency divider to output a signal for an analog display unit from the signal of the frequency divider.

2. The display signal generator device according to claim 1 wherein said pulse generator is a one-shot multivibrator.

3. The display signal generator device according to claim 1 wherein said pulse generator is a counter for generating a pulse having a predetermined pulse width by the counting of a clock signal.

* * * * *